United States Patent [19]
Zheng

[11] Patent Number: 6,140,887
[45] Date of Patent: Oct. 31, 2000

[54] WIDE BAND DIRECTIONAL COUPLER

[75] Inventor: Wei Ping Zheng, Brooklyn, N.Y.

[73] Assignee: Scientific Components, Brooklyn, N.Y.

[21] Appl. No.: 09/235,203

[22] Filed: Jan. 22, 1999

Related U.S. Application Data

[60] Provisional application No. 60/087,743, Jun. 2, 1998.

[51] Int. Cl.[7] ....................................... H03H 7/38
[52] U.S. Cl. ............................. 333/112; 333/118
[58] Field of Search ..................... 333/112, 118, 333/25, 32

[56] References Cited

U.S. PATENT DOCUMENTS 4,042,887  8/1977  Mead et al. ............................... 330/53

*Primary Examiner*—Benny Lee
*Assistant Examiner*—Kimberly Glenn
*Attorney, Agent, or Firm*—Kevin Redmond

[57] ABSTRACT

A wide band directional coupler of the type using ferrite cores and discrete winding in which a special winding method and its position on the core improves coupling flatness, directivity, as well as input and output VSWR.

3 Claims, 5 Drawing Sheets

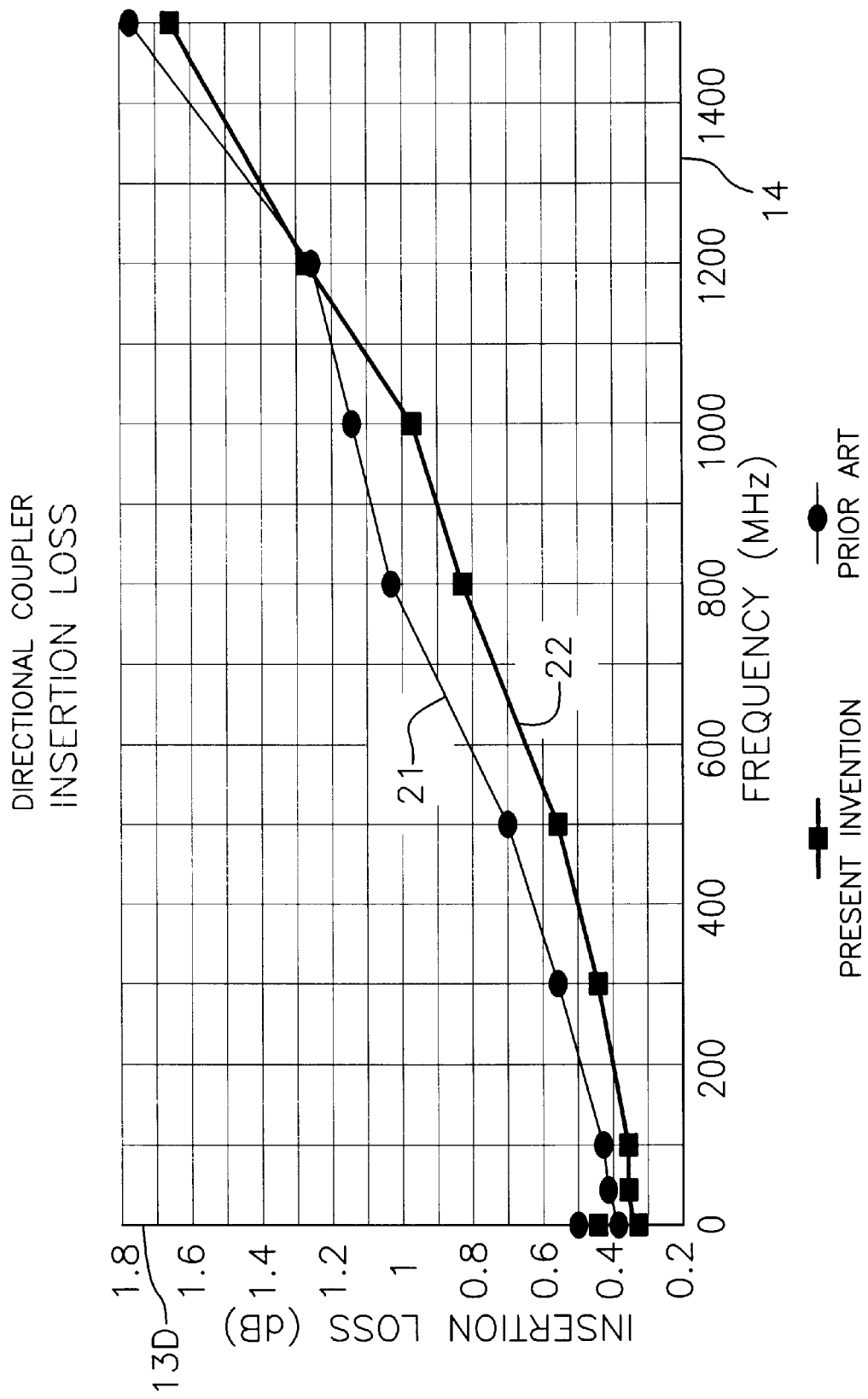

WIDE BAND DIRECTIONAL COUPLER

This application claims benefit of provisional application 60/087,743, filed Jun. 2, 1998.

BACKGROUND

1. Field

This invention relates to directional couplers and more particularly to couplers that employ discrete windings on ferrite cores.

2. Prior Art

FIG. 1 shows the schematic diagram of a prior art directional coupler. FIG. 3 shows the typical location of the windings on a binocular ferrite core for the coupler shown in FIG. 1. This type of core is referred to as a binocular core because of its shape. See the side view in FIG. 3A. In FIG. 1, the input of the main through line is port 2, while the output of this line is port 3. The coupled line input port is 4 while the output of this line is port 5. A winding 6 is connected in series with the main line, while a winding 7 is connected in series with the coupled line. Winding 6 is coupled to a main line secondary winding 8, while winding 7 is coupled to the couple line secondary winding 9. Winding 8 is connected at one end to ground and at the other end to port 5, while winding 9 is connected at one end to ground and at the other end to port 3. Note that in FIGS. 2 and 3, all windings have a first and a second end. The first end being located to the left proximate the input ports 2 and 4 and the second end being located to the right.

In the operation of this coupler, a first signal placed on the main line at port 2 leaves at port 3 and will produce two effects on the coupled line. First, a portion of this first signal will flow from port 3 through coil 9 to ground, inducing a second signal in coil 7 and thus onto the coupled line. This will occur regardless of whether the first signal on the main line is applied to port 2 or port 3.

The second effect on the coupled line is the first signal on the main line passing through coil 6 induces a third signal in coil 8 which feeds this signal to port 5 and thus onto the coupled line. However, this third signal on the coupled line has a direction depending on whether the signal on the main line is fed into port 3 or port 2 because it goes through a transformer comprised of coils 6 and 8. In a transformer, the direction of the first signal in the primary dictates the direction of the signal in the secondary.

It can be seen from the above discussion that the second and third signals are placed onto the coupled line. The third signal is directional and its direction depends on the direction of the first signal on the main line. The second and third signals are set to be nearly equal to each other so that a first signal flowing in one direction on the main line will cause the two reflected signals on the coupled line to aid, while a signal flowing in the opposite direction on the main line will cause the two signals on the coupled lines to cancel.

This characteristic produces the directionality of the coupler, and provides a signal out of the coupled line only when the first signal flowing on the main line is flowing in a specific direction.

All the windings for the directional coupler may be wound on a single binocular core as shown in FIGS. 3 and 3A. In FIG. 3, a core 12, having a first hole 12A and a second hole 12B, contains a winding 8 in the first hole and a winding 9 in the second hole. These winding are broken into two portions. That is, winding 8 has two parts, referred to as subwindings 8A and 8B which are connected in series and which, when considered together, comprise the complete winding 8. As can be seen in FIG. 3A, subwinding 8A is typically wound on the side of the core, while subwinding 8B is typically wound on the top of the core. Note that FIG. 3A shows a side cross sectional view of the binocular core 12 and the hole 12A passes through the core in a longitudinal direction.

Winding 9 is similarly broken in to subwinding 9A and 9B and these windings are located on the side and top respectively of the second hole 12B. The primary for winding 8, which is winding 6 shown in FIG. 1, is placed in the first hole 12A, while winding 7, also shown in FIG. 1, is placed in the second hole. However, the windings 6 and 7 are not shown in FIG. 3 to more clearly show windings 8 and 9 which are important in explaining the operation of the present invention and how this invention differs from the prior art. A problem occurs with this prior art arrangement of the windings on the core. The coupling through the core falls off at high frequencies reducing the performance that can be achieved at high frequency. There is a need to provide a different core winding scheme to obtain improved flatness, directivity and VSWR at high frequencies especially above 1000 MHz.

SUMMARY

The present invention is a wide band directional coupler of the type using ferrite cores and discrete windings in which a special winding method and the position on the core of these special winding improves coupling flatness, and directivity as well as input and output VSWR.

The secondary windings in this type of directional coupler are in prior art couplers typically split and wound on two different locations on the core. At high frequencies, there is usually insufficient coupling through the core between the two halves of the secondary windings causing a fall off in the flatness, directivity and input and output VSWR. Placing both halves of the secondary windings in the same location on the core has resulted in even poorer performance, but when, in accordance with the present invention, the two halves of the secondary windings are replaced by a single bifilar winding located in one place on the core, the desired improvement in performance is achieved.

BRIEF DESCRIPTION OF THE DRAWINGS

FIG. 8 is a graph showing insertion loss as a function of frequency for a coupler fabricated in accordance with the present invention and a coupler fabricated in accordance with the prior art.

DETAILED DESCRIPTION OF THE INVENTION

FIGS. 5 through 8 are graphs that show the performance of a conventional coupler and a coupler fabricated in accordance with the present invention. In these graphs, drawing numeral 14 indicates the horizontal axis which is always the frequency axis and covers the range from zero to 1600 MHz. The vertical axis is designated by drawing numeral 13 followed by letter A through D corresponding to FIGS. 5 through 8. The vertical axis in each case corresponds to the performance parameter which is respectivity for FIGS. 5 through 8, the input return loss, directivity, coupling and insertion loss.

Figure 5:
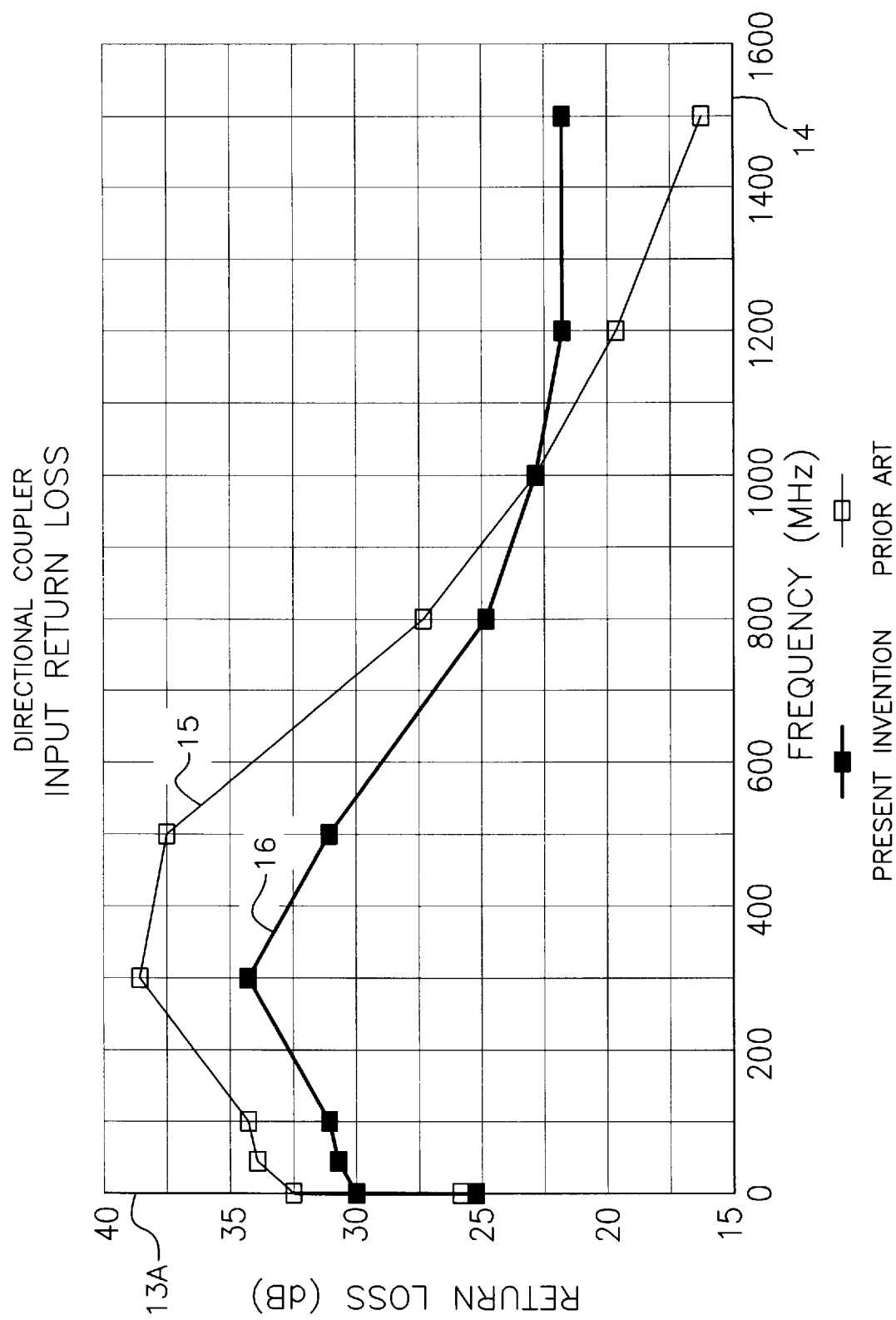
FIG. 5 is a graph showing the input return loss as a function of frequency for a coupler fabricated in accordance with the present invention and a coupler fabricated in accordance with the prior art.
Figure 6:
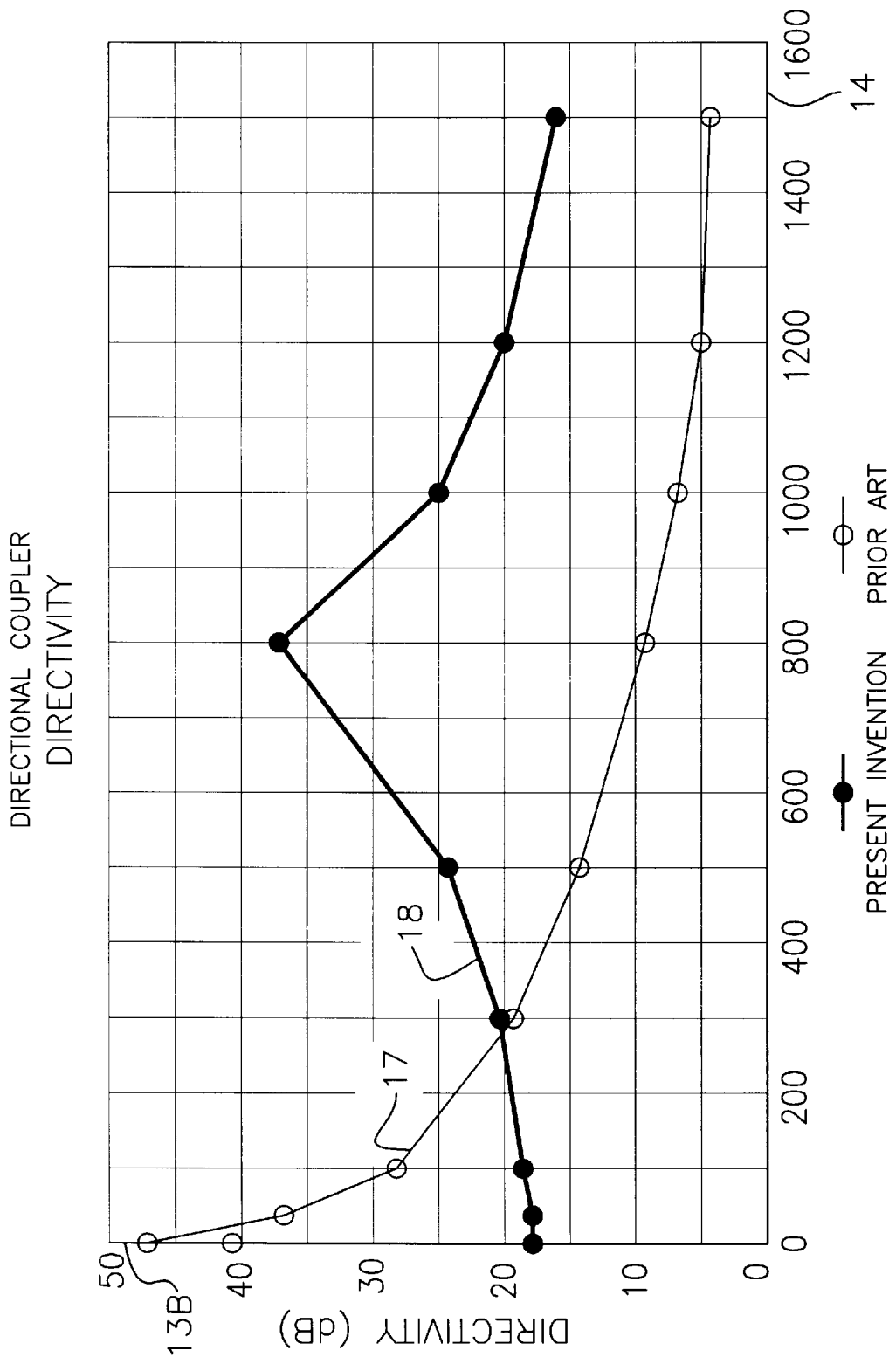
FIG. 6 is a graph showing directivity as a function of frequency for a coupler fabricated in accordance with the present invention and a coupler fabricated in accordance with the prior art.

In FIG. 5, it can be seen that the prior art return loss is only 17 dB at 1500 MHz while the return loss of the present invention is 22 dB. In FIG. 6, it can be seen that the directivity of the prior art drops below 20 dB at 300 MHz and falls lower, while that of the present invention raised to 37.5 dB and only falls again to 20 dB at 1200 MHz.

Figure 7:
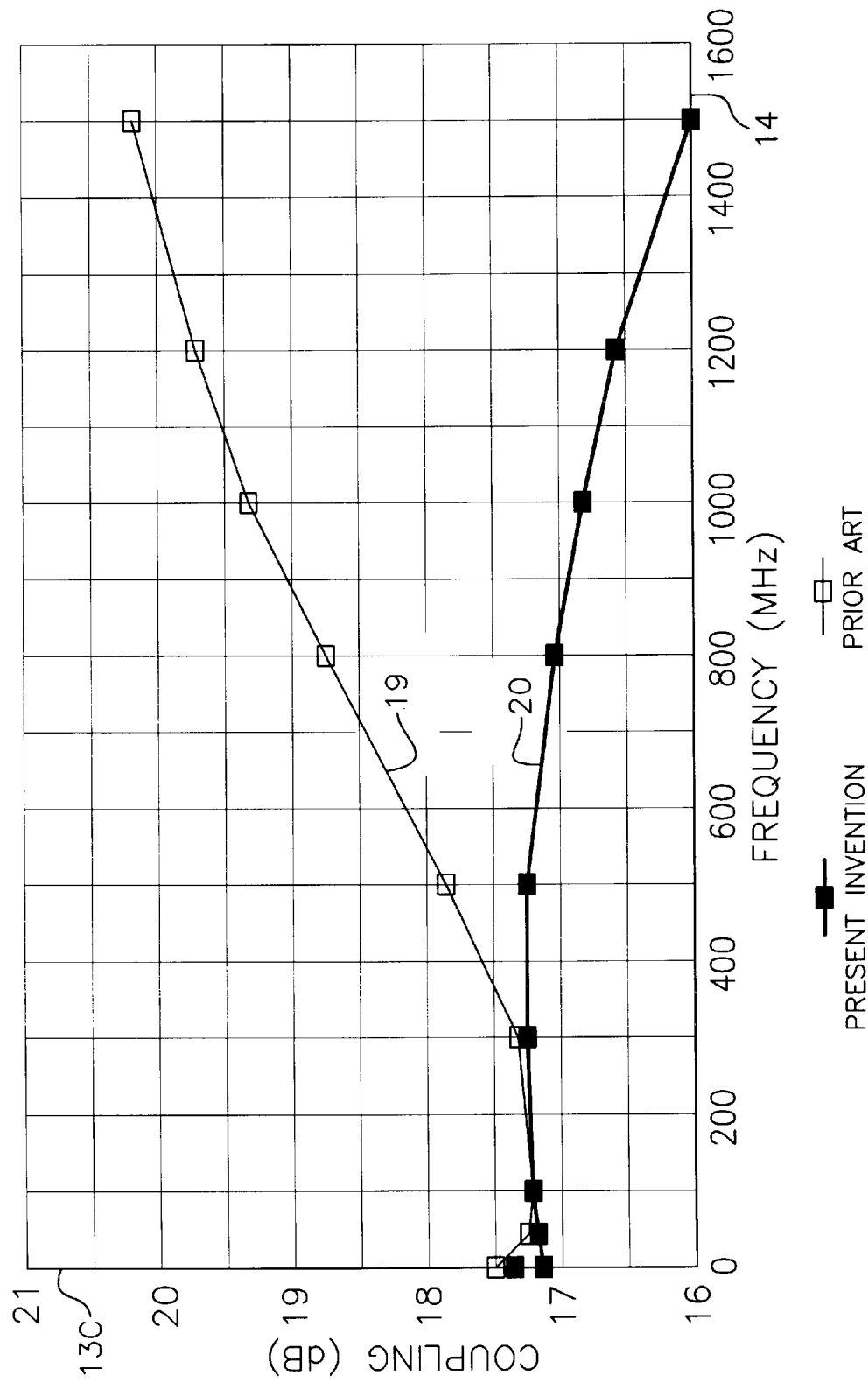
FIG. 7 is a graph showing coupling as a function of frequency for a coupler fabricated in accordance with the present invention and a coupler fabricated in accordance with the prior art.

In FIG. 7, a dramatic difference between the coupling performance of the present invention and the prior art can be seen.

The purpose of the coupler is to couple a signal from the main line to the coupled line at a nearly constant value over the entire frequency range of the device. This is done by the present invention. The coupling varies only from slightly above 17 dB at low frequencies to 16 dB at 1500 MHz. On the other hand, the conventional coupler rises from slightly over 17 dB to 20 dB.

FIG. 8 shows another important parameter of a coupler, the insertion loss. At every frequency the present invention is as good as the prior art unit or better and in many cases the present invention is 0.2 dB better. It clearly can be seen from these graphs that the present invention provides a significant improvement over prior art devices.

Referring back to FIG. 7, which shows the coupling as a function of frequency, it can be seen that the coupling in the prior art coupler falls off sharply after 200 MHz. It is apparent that the coupling from the main line to the coupled line is dropping off rapidly with frequency.

The reason for this is the coupling through the core material falls off with frequency. The arrangement of the windings on the core was examined to determine if the coupling at the high frequency end of the band could be improved.

Figure 3A:
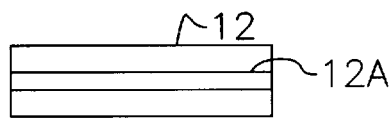
FIG. 3A is a side cross sectional elevation view of a binocular core.
Figure 3:
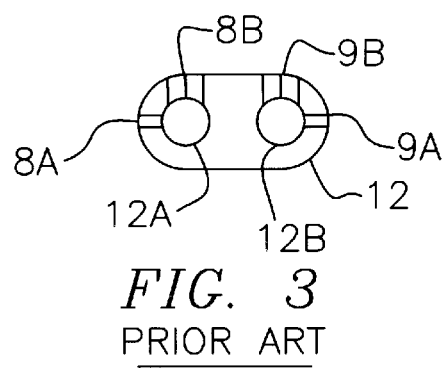
FIG. 3 is a front elevation view of a binocular core showing the arrangement of the secondary windings of a prior art coupler.
Figure 4:
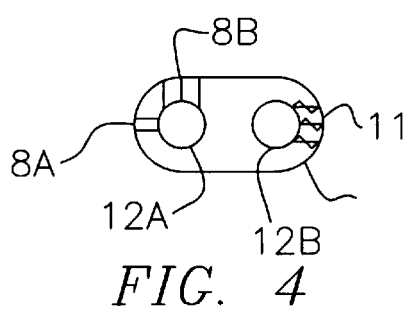
FIG. 4 is a front elevation view of a binocular core showing the arrangement of the secondary winding of a coupler fabricated in accordance with the present invention.

In FIG. 3, winding 9 is broken into two windings 9A and 9B. Winding 9B is shown separated from winding 9A. To avoid depending on the coupling through the core material to provide the necessary coupling between these winding and winding 7, the winding were all placed on the side of the core where winding 9A is shown in FIG. 3. This simplified approach to increasing the coupling resulted in even poorer performance than was obtained from the prior art device as shown in FIG. 7. Winding simply "bunched" together at a frequency of over 1000 MHz do not perform well because of the parasitic capacitance and inductances of these windings. A bifilar winding was then investigated because it provided a transmission line type coupling which forms a controlled transformer type action at higher frequencies.

Figure 1:
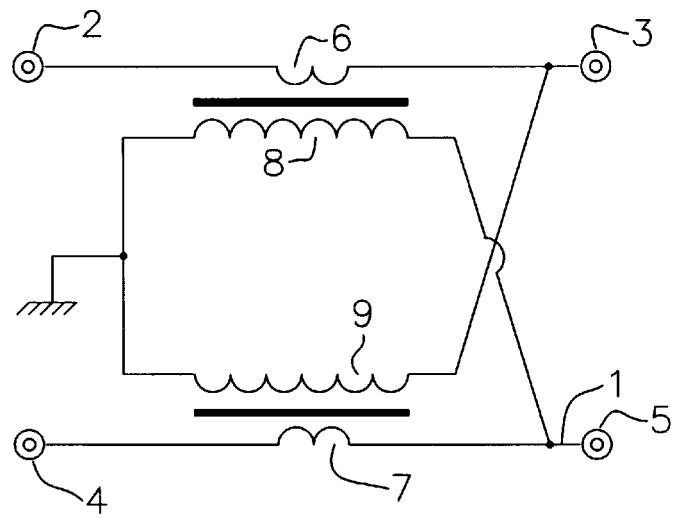
FIG. 1 is a schematic of a prior art directional coupler.
Figure 2:
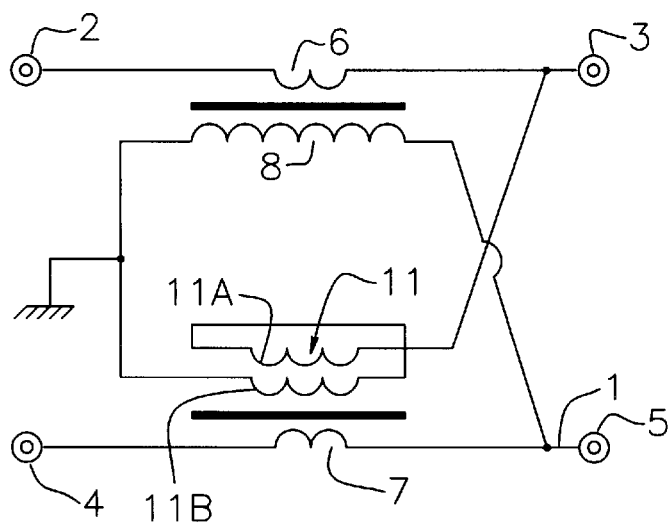
FIG. 2 is a schematic of a coupler fabricated in accordance with the present invention.

The schematic for this type of winding is shown in FIG. 2. The drawing numeral are the same as in FIG. 1 except for the bifilar winding 11 which now replaces the non-bifilar winding 9.

The bifilar winding is comprised of a twisted pair of a first bifilar line 11A and a second bifilar line 11B. The bifilar lines have a first end to the left in FIG. 2 and a second end to the right in FIG. 2. The second end of the second bifilar line is connected to the first end of the first bifilar line. Note that the first ends of the first and second bifilar lines are proximate the input ports 2 and 4 respectively of the main through line and the coupled line. This controlled approach to improved coupling functions well as can be seen by the performance graphs for the present invention shown in FIGS. 5 through 8. It should be noted that bifilar windings are not normally used in the way they are used in the present invention. Bifilar transformers usually have their primary and secondary interconnected and both the "primary" and "secondary" use bifilar winding. In the present invention, only the secondary use a bifilar winding and there is no interconnection, yet the significantly improved performance has been repeatedly achieved with this configuration.

Having described my invention, I claim:

1. A directional coupler which includes a ferrite core, a main through line having an input and an output port, a coupled line having an input and an output port, the input ports of said main and coupled lines being adjacent to one another, a first winding about said core in series with the main through line, a second winding about said core in series with the coupled line, a third winding about said core coupled to said first winding, a fourth winding about said core coupled to said second winding, said third and fourth windings each having a first and a second end, said first ends of said third and fourth windings being grounded, and said second ends of said third and fourth windings being connected to the output ports of said coupled and main through line respectively, and wherein said fourth winding is a bifilar winding and said first ends of said third and fourth windings are located proximate said input ports of said main through line and said coupled line and wherein said bifilar winding has a first and a second end and consists of a first and a second bifilar line, the first bifilar line being connected at the first end of the bifilar winding to the second line at the second end of the bifilar line, the second end of the first bifilar line being connected to the output of said main line, and the first end of the second bifilar line being connected to ground.

2. A directional coupler as claimed in claim 1, wherein said ferrite core contains a first and a second aperture, and said first and third windings are wound about said core through said first aperture and said second and fourth windings are wound about said core through said second aperture.

3. A directional coupler as claimed in claim 2, wherein said core is a binocular core.

* * * * *